(12) United States Patent
Melkonyan (10) Patent No.: US 11,569,755 B2
(45) Date of Patent: Jan. 31, 2023

(54) ACTIVE RECTIFIER CIRCUIT WITH REDUCED COMPLEXITY AND REDUCED COMPONENT COUNT

(71) Applicant: Siemens Aktiengesellschaft, Munich (DE)

(72) Inventor: Ashot Melkonyan, Munich (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 19 days.

(21) Appl. No.: 17/357,011

(22) Filed: Jun. 24, 2021

(65) Prior Publication Data

US 2021/0408933 A1   Dec. 30, 2021

(30) Foreign Application Priority Data

Jun. 26, 2020 (EP) .................................. 20182573

(51) Int. Cl.
*H02M 7/219* (2006.01)
*H02M 1/08* (2006.01)

(52) U.S. Cl.
CPC .............. *H02M 7/219* (2013.01); *H02M 1/08* (2013.01)

(58) Field of Classification Search
CPC .......... H02M 7/219; H02M 1/08; H02M 1/32; H02M 1/4208; H02M 1/4216; H02M 1/088; H03K 2017/6875; H03K 17/102; Y02B 70/10
See application file for complete search history.

(56) References Cited

U.S. PATENT DOCUMENTS

| 2008/0013352 A1* | 1/2008 | Baker ................ H02M 1/4216 363/125 |
| 2014/0104900 A1* | 4/2014 | Nguyen ................ H02M 7/42 363/44 |
| 2014/0369100 A1* | 12/2014 | Yamada ................ H02M 7/12 363/125 |

(Continued)

OTHER PUBLICATIONS

Kolar, Johann W. et al., "The Essence of Three-Phase PFC Rectifier Systems," IEEE 33rd International Telecommunications Energy Conference (INTELEC), 27 pages, Oct. 9, 2011.

(Continued)

*Primary Examiner* — Kyle J Moody
*Assistant Examiner* — Jye-June Lee
(74) *Attorney, Agent, or Firm* — Slayden Grubert Beard PLLC (57) ABSTRACT

A rectifier circuit has one or more bridge circuits each with: a first leg with two diodes in series and an AC terminal at a midpoint between the two, a second leg with two semiconductor switches in parallel to the first, a third diode connected to a upper node of each leg, a fourth diode connected to a lower node of each leg, and a capacitor leg with two capacitors in series between the third and fourth diode. A midpoint between the capacitors is connected to a midpoint between the semiconductor switches. The first arrangement is two controllable semiconductor switches in series. A gate node of the second is connected to a first load terminal of the first switch and the first load terminal is connected to the lower node. The second semiconductor switch is a third controllable semiconductor switch with a gate node connected to the lower node.

8 Claims, 5 Drawing Sheets

(56) References Cited

U.S. PATENT DOCUMENTS

2020/0119658 A1* 4/2020 Zhang .................. H02M 7/487

OTHER PUBLICATIONS

Zojer, Bernhard, "A New Driving Concept for Normally-on GaN Switches in Cascode Configuration," IEEE Applied Power Electronics Conference and Exposition (APEC), pp. 996-1001, Mar. 20, 2016.
Liu, Zhengyang et al., "Digital-Based Interleaving Control for GaN-Based MHz CRM Totem-Pole PFC," IEEE Journal of Emerging and Selected Topics in Power Electronics, vol. 4, No. 3, pp. 808-814.

* cited by examiner

ACTIVE RECTIFIER CIRCUIT WITH REDUCED COMPLEXITY AND REDUCED COMPONENT COUNT

CROSS-REFERENCE TO RELATED APPLICATIONS

This application claims priority to EP Application No. 20182573.4 filed Jun. 26, 2020, the contents of which are hereby incorporated by reference in their entirety.

TECHNICAL FIELD

The present disclosure relates to circuits. Various embodiments include active rectifier circuits for converting between a single phase or multi-phase AC voltage and a DC voltage.

BACKGROUND

Typical grid connected power electronics equipment, for example battery chargers, motor drives, or AC coupled switch mode power supplies (SMPS) employ active or passive power factor correction units in order to fulfil different grid norms. Active power factor correction units or active front end converters—commonly named active rectifiers—use controllable semiconductor switches to achieve their functionality.

An example three-phase power factor correction topology is the unidirectional three-level rectifier called Vienna rectifier, which has advantages over the conventional six-switch bridge topology. The Vienna rectifier topology uses a switching arrangement to provide a controllable boost connection. This controllable connection must be able to block voltage of both polarities. In the basic Vienna rectifier setup this is achieved by arranging a single controllable semiconductor switch within a rectifying diode bridge. Alternative Vienna type topologies (NPFC, SPFC, ANPFC) use more than one power semiconductor and accompanying gate driver units.

SUMMARY

The teachings of the present disclosure include an active rectifier circuit having reduced complexity and reduced component count. For example, some embodiments include a rectifier circuit in accordance with the invention comprises one or more bridge circuits. Each bridge circuit in turn comprises a first series comprising a first and second diode, a first midpoint between the first and second diode forming an AC terminal of the rectifier circuit and a second series comprising a first and second semiconductor switching arrangement. The first and second series are in parallel by being connected at an upper node and a lower node. A third diode is connected to the upper node and a fourth diode is connected to the lower node.

As another example, some embodiments include a rectifier circuit (30, 50), comprising one or more bridge circuits (32, 51), each bridge circuit (32, 51) comprising: a first series comprising a first and second diode (231, 331, 232, 332), a first midpoint between the first and second diode (231, 331, 232, 332) forming an AC terminal of the rectifier circuit (30, 50), a second series comprising a first and second semiconductor switching arrangement, the first and second series being arranged in parallel, a third diode (381) connected to upper nodes of the first and second series, a fourth diode (382) connected to lower nodes of the first and second series, wherein the first semiconductor switching arrange- ment comprises a series of a first and second controllable semiconductor switch (36, 37), wherein the gate node of the second controllable semiconductor switch (36) is connected to a first load terminal of the first controllable semiconductor switch (37) and the first load terminal is connected to the lower node, and the second semiconductor switching arrangement comprises a third controllable semiconductor switch (35), wherein the gate node of the third controllable semiconductor switch (35) is connected to the lower node, and wherein the rectifier circuit (30, 50) further comprises a capacitor series comprising two capacitors connected between the third and fourth diode (381, 382), a second midpoint (16) between the capacitors being connected to a third midpoint between the semiconductor switching arrangements.

In some embodiments, there is an avalanche diode (40) or Zener diode between the gate node of the third controllable semiconductor switch (35) and the lower node.

In some embodiments, the first controllable semiconductor switch (37) is an enhancement mode semiconductor switch.

In some embodiments, the second and third controllable semiconductor switches (35, 36) are depletion mode semiconductor switches.

In some embodiments, the second and third controllable semiconductor switches (35, 36) are GaN HEMT or SiC JFET switches.

In some embodiments, there is a gate driver unit (39) connected to the gate node of the first controllable semiconductor switch (37).

In some embodiments, there is a gate driver unit (39) connected to the gate node of the second controllable semiconductor switch (36) and a de-coupling diode (53) connected between the gate node of the second controllable semiconductor switch (36) and the lower node.

In some embodiments, the gate node of the first controllable semiconductor switch (37) is connected to a supply voltage terminal (52).

BRIEF DESCRIPTION OF THE DRAWINGS

The teachings of the present disclosure are now described with reference to the accompanying drawings to which the invention is not limited. The illustrations of the drawings are in schematic form. It is noted that in different figures, similar or identical elements use the same reference signs.

DETAILED DESCRIPTION

In some embodiments, the first semiconductor switching arrangement comprises a series of a first and second controllable semiconductor switch, wherein the gate node of the second controllable semiconductor switch is connected to a first load terminal of the first controllable semiconductor switch and the first load terminal is connected to the lower node. The second semiconductor switching arrangement comprises a third controllable semiconductor switch, wherein the gate node of the third controllable semiconductor switch is connected to the lower node. The rectifier circuit further comprises a capacitor series comprising two capacitors connected between the third and fourth diode, a second midpoint between the capacitors being connected to a third midpoint between the semiconductor switching arrangements.

In some embodiments, the rectifier circuit uses a cascode structure for the first, second, and third controllable semiconductor switch. In this way, a traditional setup of two controllable semiconductor switches as used in the symmetric boost PFC, both of which require their own gate driver unit, is replaced with a setup of three series-connected controllable semiconductor switches of which only one requires a gate driver unit. In this way the complexity and cost associated with providing gate driver units for the rectifier circuit is reduced. The advantages of the three-level topology over a conventional 6-switch bridge and the advantages of the symmetric boost PFC are retained.

The term "controllable semiconductor switch" is used to denote power semiconductor elements such as JFETs, MOSFETs or IGBTs that comprise two load terminals and a control (gate) terminal that allows controlling the conduction state across the load terminals.

In some embodiments, the rectifier may be adapted to work with a single-phase AC voltage by having a single bridge circuit. It may be adapted for use with a multi-phase AC voltage by providing more than one bridge circuit. In this case the bridge circuits are connected in parallel with each bridge circuit being connected to a respective AC voltage phase and the third midpoints of each bridge circuit being interconnected.

In some embodiments, the AC terminal may be connected to the AC voltage across an inductive element to provide boost functionality.

In some embodiments, the rectifier circuit may comprise a voltage control diode in the form of an avalanche diode or Zener diode or a series of those between the gate node of the third controllable semiconductor switch and the lower node. This voltage control diode serves to protect the gate node of the third controllable semiconductor switch from excessive voltage difference to its (source) load node.

In some embodiments, the first controllable semiconductor switch may be an enhancement mode semiconductor switch. This provides a normally-off functionality for the setup of the first and second switching arrangements as the gate connections of the second and third controllable semiconductor switch ensure that these devices are turned off when the first controllable semiconductor switch is turned off.

In some embodiments, the second and third controllable semiconductor switches may be depletion mode semiconductor switches. Some of the technologically most advanced switches are currently only available or take their form as normally-on devices.

In some embodiments, the second and third controllable semiconductor switches may be GaN HEMT or SiC JFET type switches. In addition, the second and third controllable semiconductor switch may be of equal type and voltage rating. The first controllable semiconductor switch may be a Si-MOSFET device. The first controllable semiconductor switch may have a lower voltage rating than the second and third controllable semiconductor switch. In some embodiments, the first controllable semiconductor switch may have a voltage rating of only 30 V while the second and third controllable semiconductor switch may have voltage ratings of 650 V. In this way, the rectifier may be built for operation with a DC link voltage of for example 800 V while still using only a single gate driver unit driving a low-voltage switch.

In some embodiments, the rectifier circuit may comprise a gate driver unit connected to the gate node of the first controllable semiconductor switch. In this way a cascode-like structure is used as the first switching arrangement. The first and second switching arrangements act also as an extended cascode structure. Turning off the first controllable semiconductor switch through the gate driver unit will lead to the second and third controllable semiconductor switches being turned off as well. Turning on the first controllable semiconductor switch will lead to the second and third controllable semiconductor switch being turned on. In some embodiments, the single gate driver unit may be the only gate driver unit for one bridge circuit.

In some embodiments, the gate driver unit is connected to a control device which controls operation of the gate driver unit or gate driver units in case of multiple and thus of the rectifier circuit.

The control device is arranged to control the gate driver unit to perform a pulse-width modulation switching scheme that operates in both half-waves of a connected AC voltage and performs a voltage boost to a predefined DC voltage across the capacitors resulting in a predefined DC output voltage.

In some embodiments, the rectifier circuit may comprise a gate driver unit connected to the gate node of the second controllable semiconductor switch and a separation diode connected between the gate node of the second controllable semiconductor switch and the lower node. In this setup, the second controllable semiconductor switch is controlled directly instead of indirectly through the first controllable semiconductor switch which leads to reduced switching times. The third controllable semiconductor switch is again indirectly controlled as in a cascode structure.

In this setup, if the first controllable semiconductor switch is an enhancement mode device, the gate node of the first controllable semiconductor switch may be connected to a fixed supply voltage. In this way the first controllable semiconductor switch is kept in a conducting state throughout operation. If the supply voltage is removed from operation, for example in a failure situation, the first controllable semiconductor switch will automatically turn off which will automatically lead to the second and third controllable semiconductor switch being turned off as well.

In some embodiments, the connection between the gate node of the first controllable semiconductor switch and the supply voltage may comprise a switching means to switch off the connection in certain operation situations. This switching means may be a low-speed switching means which is not a gate driver unit.

Figure 1:
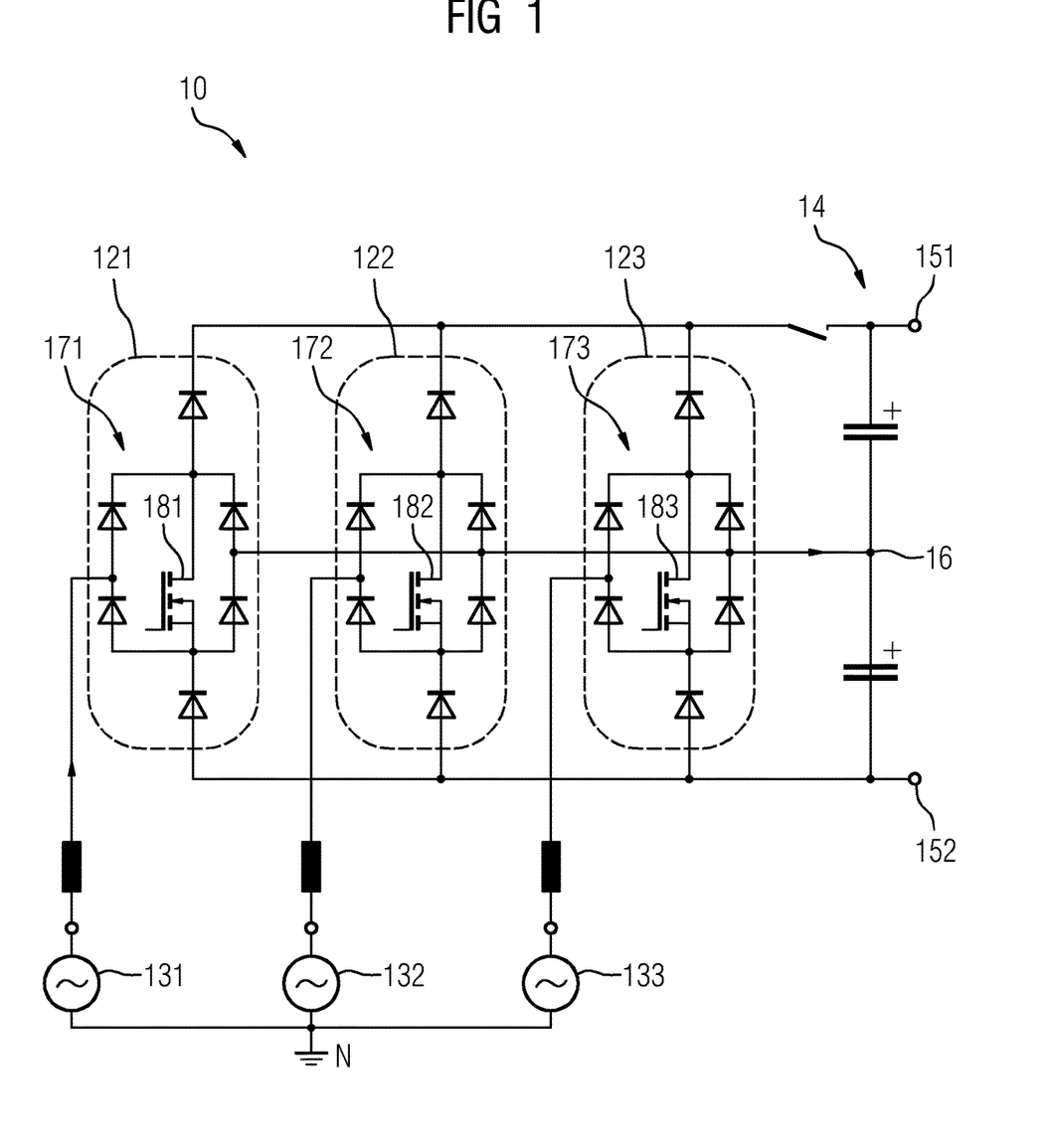
FIG. 1 illustrates a Vienna rectifier circuit known from the prior art.

A Vienna rectifier 10 known from the prior art is shown in FIG. 1. The rectifier 10 of this example is suitable for connection to a 3-phase AC network. It comprises three parallel arms for the three phases 131 . . . 133. The arms connect to a DC link 14 with an upper and lower DC terminal 151, 152. The DC link 14 comprises two capacitors arranged in a series connection with a midpoint 16 which is also connected to the arms. Each of the arms comprises a bridge circuit 121 . . . 123 having a 4-diode-bridge rectifier 171 . . . 173 with one input terminal connected to the respective AC voltage phase 131 . . . 133 and the other input terminal connected to the DC link midpoint 16. A controllable semiconductor switch 181 . . . 183 is arranged between the output terminals of the 4-diode-bridge rectifier 171 . . . 173. The output terminals of the 4-diode-bridge rectifier 171 . . . 173 are connected across further diodes to the upper and lower DC terminals 151, 152.

Figure 2:
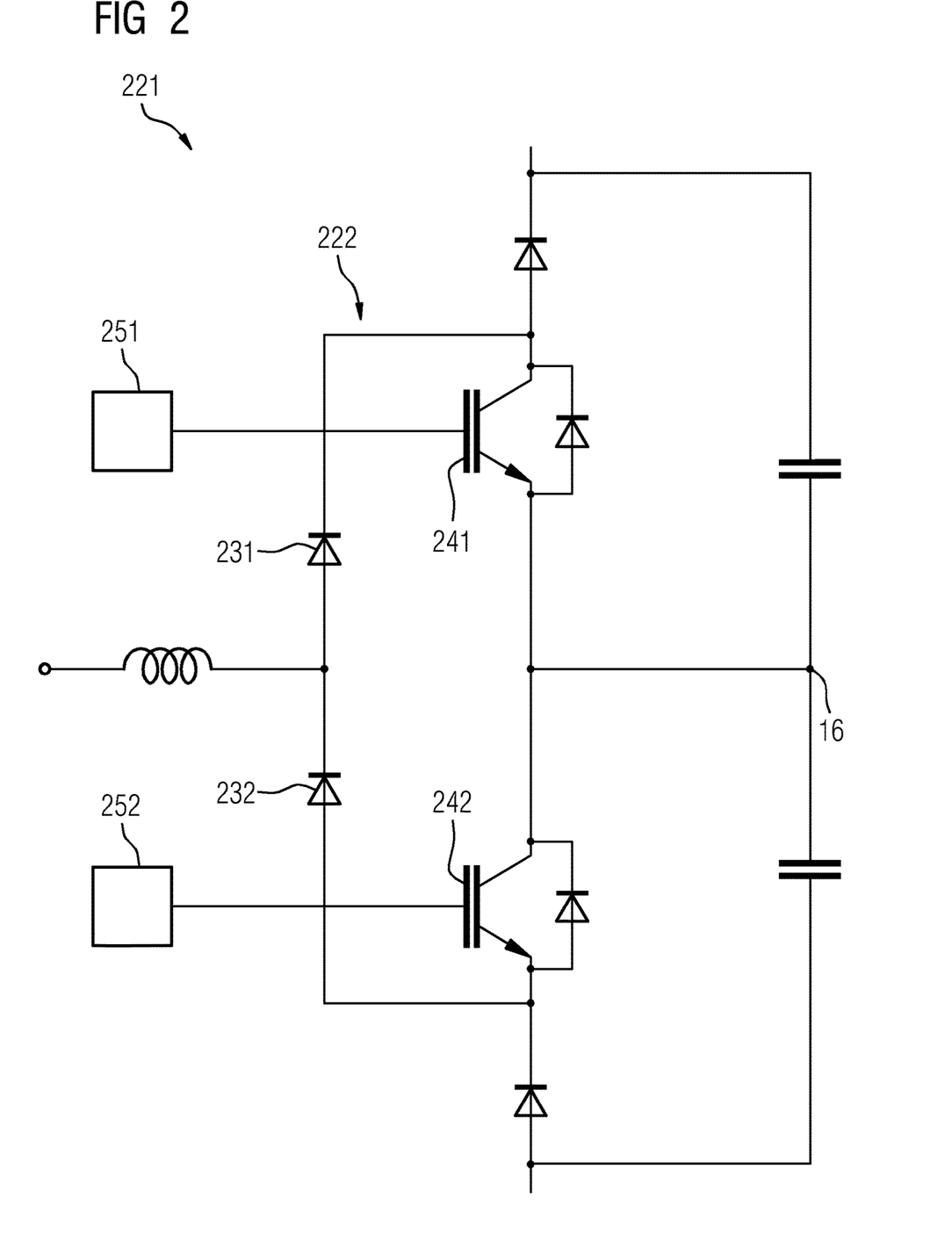
FIG. 2 illustrates a bridge circuit for the Vienna type rectifier known from the prior art.

FIG. 2 shows an alternative bridge circuit 221 known from the prior art for the rectifier as shown in FIG. 1. The bridge circuit 221 of FIG. 2 can be used in place of the bridge circuits 121 . . . 123. The bridge circuit 221 is constructed in a similar way to the bridge circuits 121 . . . 123. Instead of the 4-diode-bridge rectifier 171 . . . 173 it has a 4-element-bridge rectifier 222 comprising two diodes 231, 232 and two controllable semiconductor switches 241, 242. The bridge circuit 221 does not have controllable semiconductor switch 181 . . . 183. While the alternative bridge circuit 221 of FIG. 2 uses fewer elements overall than the bridge circuit 121 . . . 123 of FIG. 1, it requires the use of two gate driver units 251, 252 for the two controllable semiconductor switches 241, 242.

Figure 3:
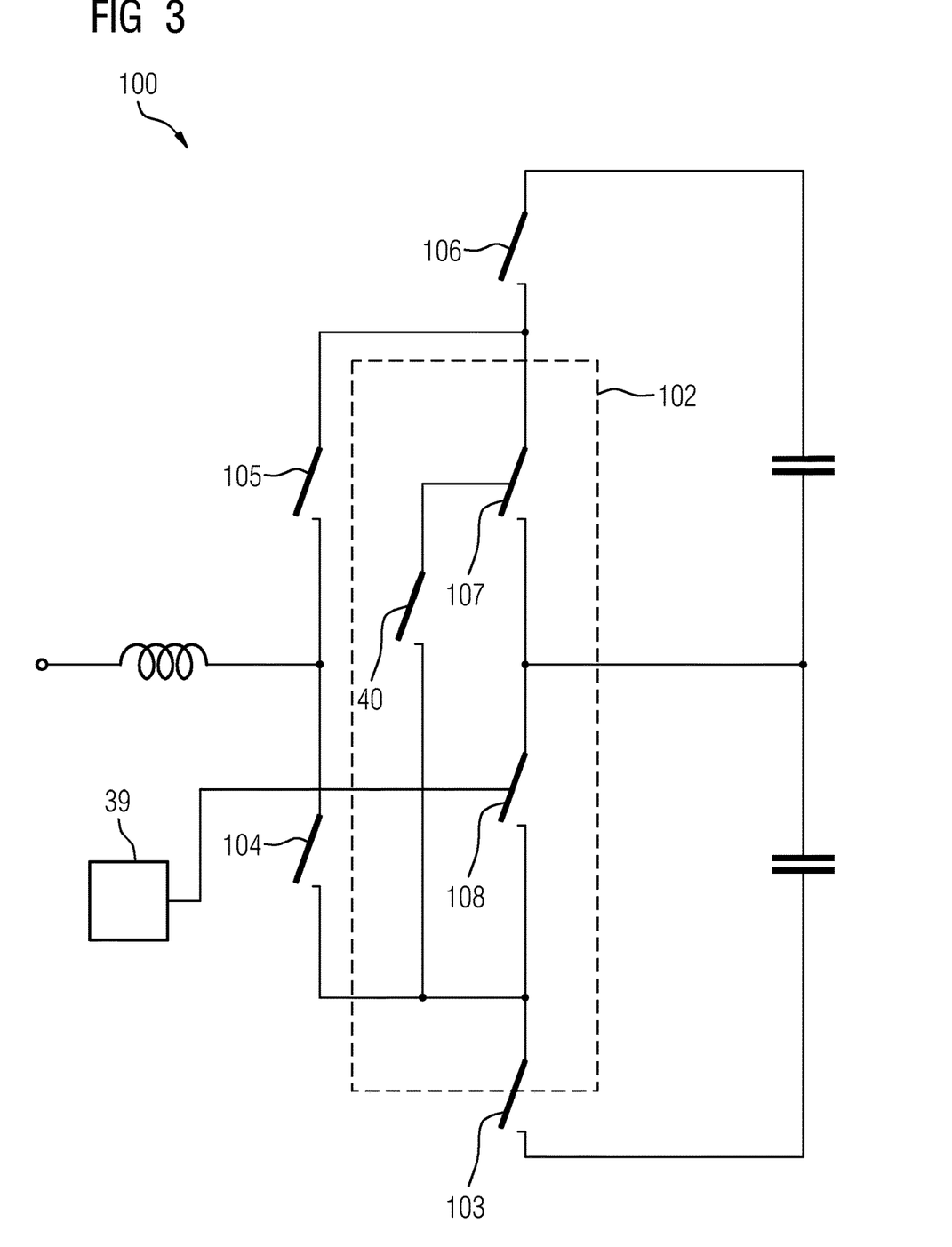
FIGS. 3 to 5 illustrate rectifier circuits incorporating teachings of the present disclosure.

FIG. 3 shows an example embodiment of the teachings of the present disclosure. FIG. 3 shows a single-phase rectifier circuit 100. This rectifier circuit 100 is based on rectifier circuit 221 but uses a cascode circuit 102 in place of the bridge circuits shown in FIGS. 1 and 2. Cascade circuit 102 comprises a series of two controllable switches 107, 108 with the gate contact of the upper of the switches 107 connected to the source terminal of the lower of the two controllable switches 108 across avalanche diode 40. The rectifier circuit 100 further comprises rectifying switches 103 . . . 106 in an arrangement similar to bridge circuit 221. More specific embodiments of this generic concept are shown and explained in FIGS. 4 and 5.

Figure 4:
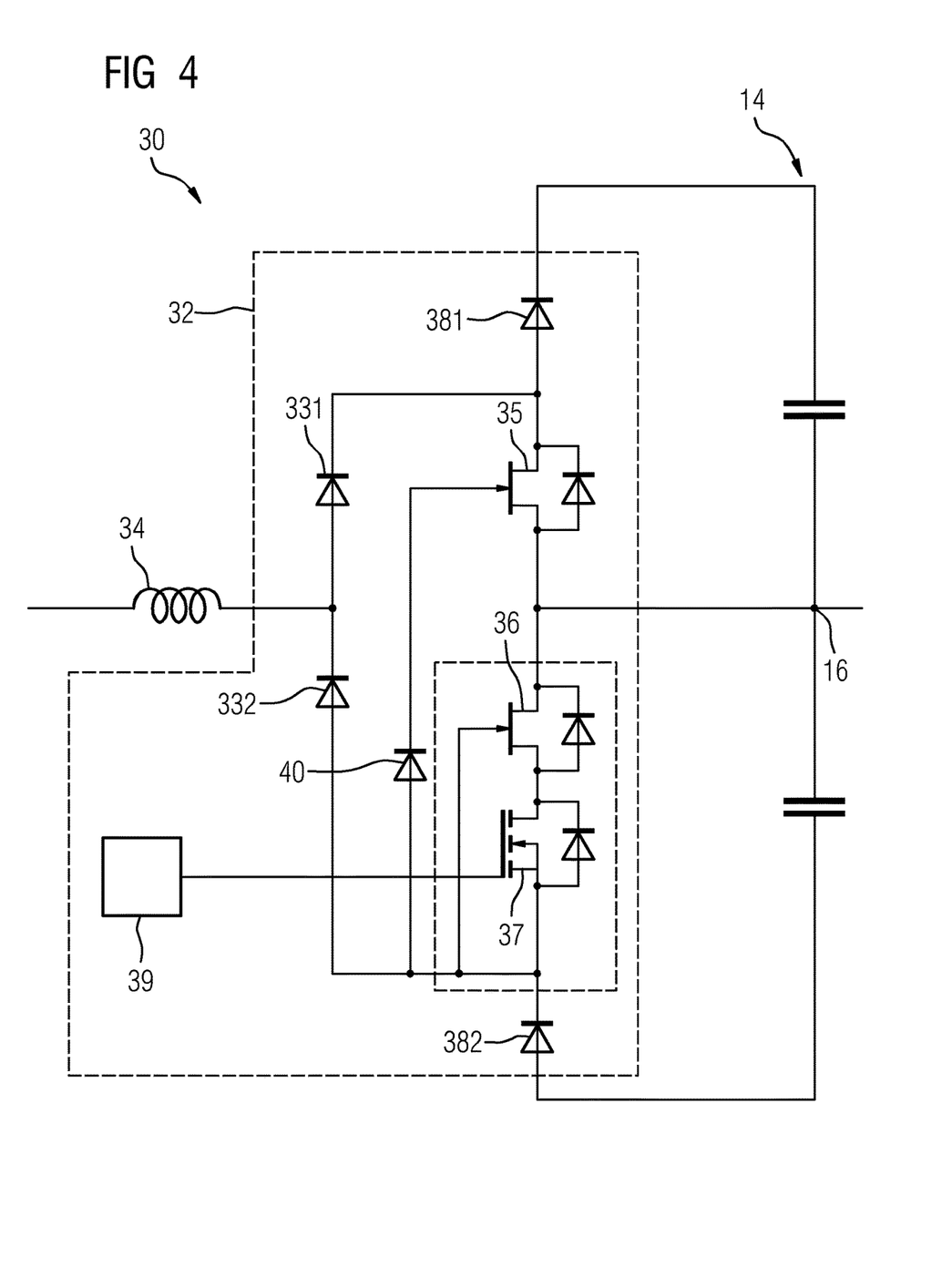

FIG. 4 shows a single-phase rectifier circuit 30 incorporating teachings of the present disclosure. This rectifier circuit 30 uses a bridge circuit 32 according in place of the bridge circuits shown in FIGS. 1 and 2. Bridge circuit 32 comprises a first series of two diodes 331, 332. A first midpoint between the diodes 331, 332 forms an AC input terminal connected to a phase of an AC voltage across an inductive element 34.

Bridge circuit 32 further comprises a second series that is connected in parallel to the first series. The second series comprises a first and second lower controllable semiconductor element 36, 37 and an upper, third, controllable semiconductor element 35 which are connected in a series connection. The second midpoint between the upper and lower controllable semiconductor elements 35 . . . 37 is connected to the midpoint 16 of DC link 14. An upper connection point of the first and second series is connected to the upper DC terminal 151 across a diode 381. A lower connection point of the first and second series is connected to the lower DC terminal 152 across a diode 382.

The upper controllable semiconductor element 35 and the second lower controllable semiconductor element 36 of the second series are normally-on (depletion mode) semiconductors. One example of such a device is a normally-on GaN HEMT (gallium nitride high electron mobility transistor). The first lower controllable semiconductor element 37 in turn is a normally-off (enhancement-mode) semiconductor such as an enhancement mode silicon MOSFET. In this embodiment the second and third semiconductor elements 35, 36 have a voltage rating of 650 V each while the first semiconductor element 37 is a low-voltage device with a voltage rating of only 30 V.

In some embodiments, the bridge circuit 32 comprises a single gate driver unit 39 which is connected to the gate contact of the first lower controllable semiconductor element 37 and allows full control of the operation of this semiconductor element 37. The gate contacts of both the upper controllable semiconductor element 35 and the second lower controllable semiconductor element 36 are connected to the source contact of the first lower controllable semiconductor element 37 and thus to the lower connection point of the first and second series. In the case of the upper controllable semiconductor element 35 this connection comprises an avalanche diode 40 that is chosen to offset most of the voltage that the lower DC link capacitor holds during operation of the rectifier to protect the gate from overvoltage, leaving only a voltage of 10-20 V between the gate and source contacts of the second semiconductor element 36. For example, in a rectifier circuit for a DC link voltage of 800 V across both capacitors the avalanche diode may be chosen to offset 380 V. Avalanche Diode 40 may comprise a series of two or more diodes to achieve the required voltage.

During operation all switching of the bridge that is formed from the first to third semiconductor element 35 . . . 37 is controlled from gate driver unit 39 through the first semiconductor element 37 in the form of cascode operation. All three switches 35 . . . 37 are thus switched on and off together.

Figure 5:
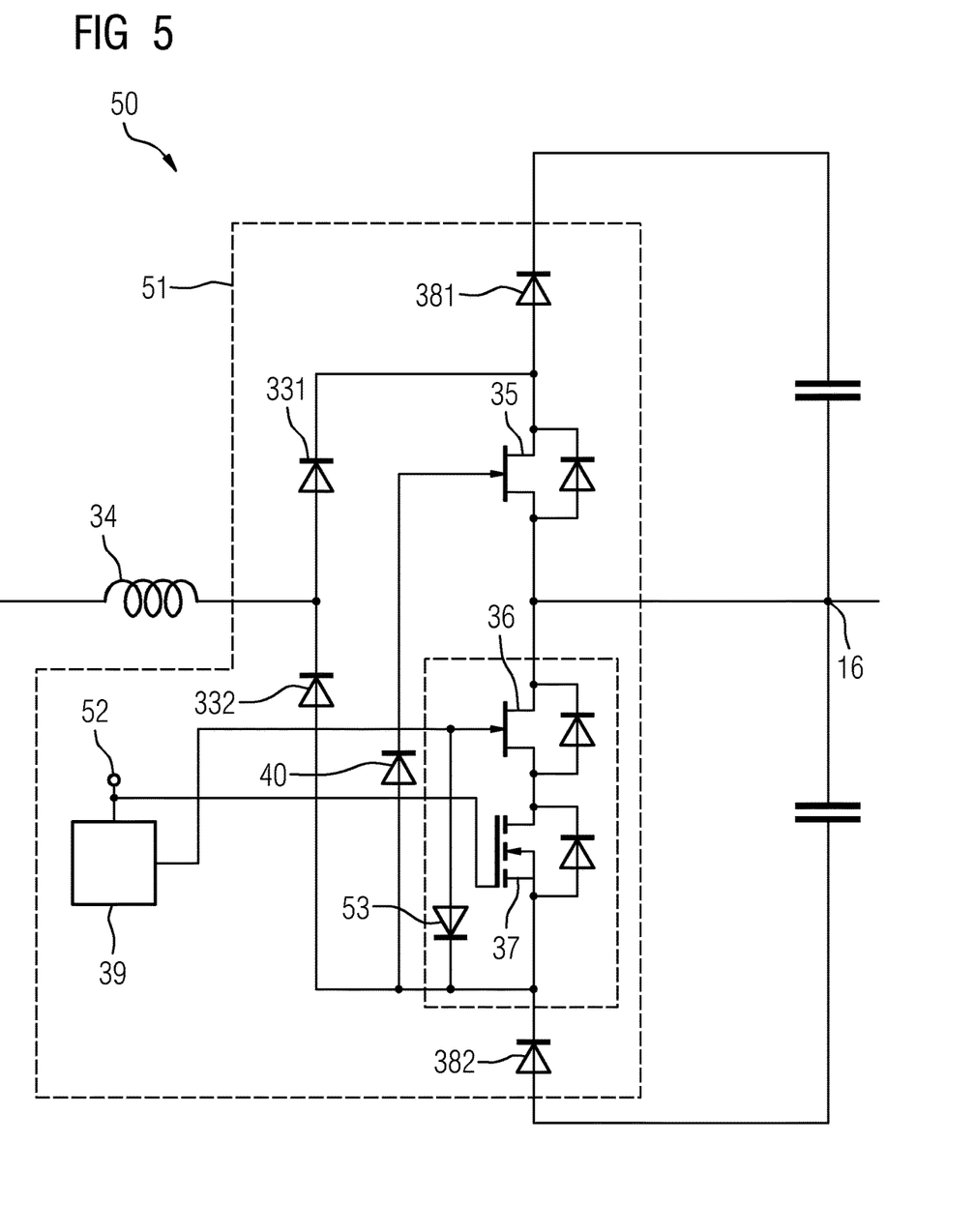

FIG. 5 shows an alternative setup according to another embodiment incorporating teachings of the present disclosure. FIG. 5 shows a single phase rectifier circuit 50 which is largely similar to single phase rectifier circuit 30. Contrary to single phase rectifier circuit 30, the single gate driver unit 39 is connected to the gate node of the second semiconductor switch 36. In addition, a decoupling diode 53 is connected between the gate node of the second semiconductor switch 36 and the lower connection point of the first and second series.

In the embodiment shown, the gate driver unit 39 drives the second lower controllable semiconductor element 36 directly instead of indirectly through the first semiconductor element 37. To enable this, the gate node of the first lower controllable semiconductor element 37 is connected directly to a supply voltage terminal 52. The first lower controllable semiconductor element 37 is thus in a permanent on-state as long as the supply voltage is present.

When the supply voltage is not present, for example due to a failure within the rectifier circuit, the first lower controllable semiconductor element 37 will turn off. Due to the gate node connection of the second semiconductor element 36 through de-coupling diode 53 and in the presence of an AC input voltage, this gate node will then be at a lower voltage than the source node of the second semiconductor element 36, turning off the second semiconductor element 36. The third semiconductor element 35 will also turn off as described for FIG. 4. In this way, a normally-off operation is achieved as for the embodiment of FIG. 4 while at the same time only a single gate driver unit 39 is used. In addition, the second semiconductor element 36 is controlled directly by the gate driver unit 39.

Both described embodiments of the teachings herein thus enable driving a series combination of two semiconductor switches 35, 36 in a Vienna-type rectifier circuit with a single gate driver unit 39. This results in an efficient circuit, allowing for a higher voltage capability compared to the single switch Vienna rectifier topology while keeping the circuit complexity low.

LIST OF REFERENCE NUMBERS

10 Vienna rectifier
30, 50, 100 rectifier
121 . . . 123, 32, 51 bridge circuit
131 . . . 133 AC voltage phase
14 DC link
151, 152 DC terminals
16 DC link midpoint
171 . . . 173 diode bridge rectifier
181 . . . 183, 241, 242 controllable semiconductor switch 221 bridge circuit
222 four-element bridge rectifier
231, 232, 331, 332, 381, 382 diodes
239, 251, 252 gate driver units
34 inductive element
35, 36 depletion-mode switch
37 enhancement-mode switch
52 supply voltage terminal
53 de-coupling diode
102 cascode circuit
103 . . . 106 rectifying switches
107, 108 controllable switches

The invention claimed is:

1. A rectifier circuit comprising:
one or more bridge circuits, each bridge circuit including:
a first series leg comprising a first diode and a second diode, a first midpoint between the first diode and the second diode providing an AC terminal of the rectifier circuit;
a second series leg comprising a first semiconductor switching arrangement and a second semiconductor switching arrangement, the first series leg and the second series leg arranged in parallel;
a third diode connected to a respective upper node of each of the first series leg and the second series leg;
a fourth diode connected to a respective lower node of each of the first series leg and the second series leg;
wherein the first semiconductor switching arrangement comprises a first controllable semiconductor switch and a second controllable semiconductor switch connected in series;
wherein a gate node of the second controllable semiconductor switch is connected to a first load terminal of the first controllable semiconductor switch and the first load terminal is connected to a lower node;
wherein the second semiconductor switching arrangement comprises a third controllable semiconductor switch;
wherein a gate node of the third controllable semiconductor switch is connected to the lower node; and
a capacitor series leg comprising two capacitors connected between the third and fourth diode, a second midpoint between the two capacitors being connected to a third midpoint between the first and second semiconductor switching arrangements.

2. The rectifier circuit according to claim 1, further comprising an avalanche diode or a Zener diode between the gate node of the third controllable semiconductor switch and the lower node.

3. The rectifier circuit according to claim 1, wherein the first controllable semiconductor switch comprises an enhancement mode semiconductor switch.

4. The rectifier circuit according to claim 1, wherein the second controllable semiconductor switch and the third controllable semiconductor switch both comprise depletion mode semiconductor switches.

5. The rectifier circuit according to claim 4, wherein the second controllable semiconductor switch and the third controllable semiconductor switches both comprise either GaN HEMT or SiC JFET switches.

6. The rectifier circuit according to claim 1, further comprising a gate driver unit connected to the gate node of the first controllable semiconductor switch.

7. The rectifier circuit according to claim 1, further comprising:
a gate driver unit connected to the gate node of the second controllable semiconductor switch; and
a de-coupling diode connected between the gate node of the second controllable semiconductor switch and the lower node.

8. The rectifier circuit according to claim 7, wherein the gate node of the first controllable semiconductor switch is connected to a supply voltage terminal.

* * * * *